United States Patent
Shon et al.

(10) Patent No.: US 9,608,612 B2
(45) Date of Patent: Mar. 28, 2017

(54) TIME AMPLIFIER AND METHOD FOR CONTROLLING THE SAME

(71) Applicant: Industry-Academic Cooperation Foundation, Yonsei University, Seoul (KR)

(72) Inventors: Doohyun Shon, Seoul (KR); Yeomyung Kim, Seoul (KR); Tae Wook Kim, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 46 days.

(21) Appl. No.: 14/257,031

(22) Filed: Apr. 21, 2014

(65) Prior Publication Data

US 2014/0320209 A1    Oct. 30, 2014

(30) Foreign Application Priority Data

Apr. 19, 2013    (KR) ........................ 10-2013-0043589

(51) Int. Cl.
   *G06G 7/12*    (2006.01)
   *H03K 5/15*    (2006.01)

(52) U.S. Cl.
   CPC .............................. *H03K 5/15006* (2013.01)

(58) Field of Classification Search
   USPC ....................................................... 327/563
   See application file for complete search history.

(56) References Cited

U.S. PATENT DOCUMENTS

| | | | |
|---|---|---|---|
| 5,883,534 A | 3/1999 | Kondoh et al. | |
| 8,143,930 B2 | 3/2012 | Lin | |
| 2009/0261878 A1* | 10/2009 | Lin | 327/261 |
| 2011/0133772 A1* | 6/2011 | Shau | 326/30 |
| 2011/0166819 A1* | 7/2011 | Kojima | 702/120 |
| 2011/0304372 A1* | 12/2011 | Wang et al. | 327/264 |
| 2012/0032714 A1* | 2/2012 | Shimazaki et al. | 327/109 |
| 2012/0098580 A1 | 4/2012 | Wang | |
| 2012/0161840 A1* | 6/2012 | Kojima | H03K 3/0375 327/184 |
| 2012/0280732 A1* | 11/2012 | Roytman et al. | 327/175 |
| 2013/0234792 A1 | 9/2013 | Niitsu et al. | |
| 2014/0225758 A1* | 8/2014 | Lakdawala | H03M 1/04 341/118 |

FOREIGN PATENT DOCUMENTS

| | | |
|---|---|---|
| JP | H04175007 A | 6/1992 |
| JP | 2001244797 A | 9/2001 |
| JP | 2002330039 A | 11/2002 |
| KR | 1020020055934 A | 7/2002 |
| KR | 1020090022153 A | 3/2009 |
| KR | 101215760 A | 5/2011 |
| KR | 10-2011-0118458 A | 10/2011 |
| KR | 101181279 B1 | 9/2012 |

* cited by examiner

*Primary Examiner* — Lincoln Donovan
*Assistant Examiner* — Patrick Chen
(74) *Attorney, Agent, or Firm* — Carter, DeLuca, Farrell & Schmidt, LLP

(57) ABSTRACT

Provided is a time amplifier. The time amplifier includes: an SR latch providing an output at a timing determined according to a time difference between two inputs; and an operation determination unit connected to a power terminal of the SR latch and configured to determine an operation of the SR latch.

13 Claims, 12 Drawing Sheets

TIME AMPLIFIER AND METHOD FOR CONTROLLING THE SAME

CROSS-REFERENCE TO RELATED APPLICATIONS

This U.S. non-provisional patent application claims priority under 35 U.S.C. §119 of Korean Patent Application No. 10-2013-0043589, filed on Apr. 19, 2013, the entire contents of which are hereby incorporated by reference.

BACKGROUND OF THE INVENTION

The present invention disclosed herein relates to a time amplifier and a method of controlling the same.

Although CMOS technology scaling accompanies positive aspects such as performance improvement of a digital circuit and miniaturization due to the high degree of integration, analog circuit designers have experience difficulties in designing a circuit design due to gradually decreasing VDD. As an alternative to this, in relation to a typical method of obtaining information through an analog to digital converter (ADC) by carrying the information in voltage, a method of obtaining information through a time to digital converter (TDC) by carrying the information in time has been suggested recently. Such a TDC may include a time amplifier block. The time amplifier affects the resolution of the TDC greatly.

A typical time amplifier uses the metastability of a transistor basically. A metastability state of a transistor occurs when voltage is not sufficiently supplied to the gate of the transistor and this should be avoided in a typical digital circuit. In a metastability state, a current of the transistor represents the form of an exponential function, that is, a non-linear function. Accordingly, when a typical time amplifier amplifies a time difference (i.e., an input value) between two input signals by using the metastability of a transistor, because of non-linear operational characteristics of the transistor, a range of an available input value is limited greatly. Additionally, due to such non-linear operational characteristics, it is difficult for a typical time amplifier to maintain a time amplification gain constantly within a corresponding input range when an input range becomes broader.

SUMMARY OF THE INVENTION

The present invention provides a time amplifier adjusting a gain and an input range and a method of controlling the same.

The present invention also provides a time amplifier adjusting a gain and an input range separately and a method of controlling the same.

Embodiments of the present invention provide time amplifiers including: an SR latch providing an output at a timing determined according to a time difference between two inputs; and an operation determination unit connected to a power terminal of the SR latch and configured to determine an operation of the SR latch.

In some embodiments, the SR latch may include a first NAND gate and a second NAND gate performing a NAND operation.

In other embodiments, the SR latch may include a first NOR gate and a second NOR gate performing a NOR operation.

In still other embodiments, the operation determination unit may include a first operation determination unit connected to a power input terminal of the SR latch.

In even other embodiments, the first operation determination unit may include a transistor determining a power input of the SR latch according to a bias voltage applied to a gate.

In yet other embodiments, the first operation determination unit may include a current mirror determining a power input of the SR latch according to a bias voltage applied to a gate.

In further embodiments, the first operation determination unit may include a variable resistor determining a power input of the SR latch according to a resistance value.

In still further embodiments, the operation determination unit may include a second operation determination unit connected to a power output terminal of the SR latch.

In even further embodiments, the second operation determination unit may include a current mirror determining a power output of the SR latch according to a bias voltage applied to a gate.

In yet further embodiments, the second operation determination unit may include a transistor determining a power output of the SR latch according to a bias voltage applied to a gate.

In yet further embodiments, the second operation determination unit may include a variable resistor determining a power output of the SR latch according to a resistance value.

In yet further embodiments, the time amplifiers may further include: a gain calculation unit calculating a gain of the time amplifier; and a first control unit controlling the first operation determination unit to allow the gain to reach a predetermined target gain.

In yet further embodiments, the gain calculation unit may detects a time difference between two input signals of the time amplifier and a time difference of two output signals of the time amplifier and may calculate the gain by dividing the time difference between two output signals by the time difference between the two input signals.

In yet further embodiments, the first control unit may increase the bias voltage of the transistor when the gain is less than the target gain and may decrease the bias voltage of the transistor when the gain is greater than the target gain.

In yet further embodiments, the time amplifiers may further include: a time difference detection unit detecting a time difference between two input signals of the time amplifier; and a second control unit controlling the second operation determination unit so as to increase a predetermined marginal time difference when the time difference between the two input signals is greater than the predetermined marginal time difference.

In yet further embodiments, the second control unit may decrease a bias voltage of the current mirror when the time difference between two input signals is greater than the marginal time difference.

In other embodiments of the present invention, time amplifiers include: a first delay unit outputting a first delay input signal by delaying a first input signal by a predetermined time; a second delay unit outputting a second delay input signal by delaying a second input signal by a predetermined time; a first SR latch providing an output at a timing determined according to a time difference between the first delay input signal and the second input signal; a second SR latch providing an output at a timing determined according to a time difference between the first input signal and the second delay input signal; a first SR latch operation determination unit connected to a power terminal of the first SR latch and configured to determine an operation of the first SR latch; a second SR latch operation determination unit connected to a power terminal of the second SR latch and configured to determine an operation of the second SR latch; a first XOR gate outputting a first output signal by performing an XOR operation on an output of the first SR latch; and a second XOR gate outputting a second output signal by performing an XOR operation on an output of the second SR latch.

In some embodiments, the first SR latch operation determination unit may include a first operation determination unit connected to a power input terminal of the first SR latch and the second SR latch operation determination unit may include a third operation determination unit connected to a power input terminal of the second SR latch.

In other embodiments, each of the first operation determination unit and the third operation determination unit may include a transistor determining a power input of an SR latch according to a bias voltage applied to a gate.

In still other embodiments, the first SR latch operation determination unit may include a second operation determination unit connected to a power output terminal of the first SR latch and the second SR latch operation determination unit may include a fourth operation determination unit connected to a power output terminal of the second SR latch.

In even other embodiments, each of the second operation determination unit and the fourth operation determination unit may include a current mirror determining a power output of an SR latch according to a bias voltage applied to a gate.

In yet other embodiments, the time amplifiers may further include: a gain calculation unit calculating a gain of the time amplifier; and a first control unit controlling the first operation determination unit and third operation determination unit to allow the gain to reach a predetermined target gain.

In further embodiments, the gain calculation unit may detect a time difference between the first input signal and the second input signal and a time difference of the first output signal and the second output signal and may calculate the gain by dividing the time difference between the first output signal and the second output signal by the time difference between the first input signal and the second input signal.

In still further embodiments, the first control unit may increase the bias voltage of the transistor when the gain is less than the target gain and may decrease the bias voltage of the transistor when the gain is greater than the target gain.

In even further embodiments, the time amplifiers may further include: a time difference detection unit detecting a time difference between the first input signal and the second input signal; and a second control unit controlling the second operation determination unit and the fourth operation determination unit so as to increase a predetermined marginal time difference when the time difference between the first input signal and the second input signal is greater than the predetermined marginal time difference.

In yet further embodiments, the second control unit may decrease a bias voltage of the current mirror when the time difference between the first input signal and the second input signal is greater than the marginal time difference.

In still other embodiments of the present invention, methods of controlling a time amplifier include: calculating a gain of a time amplifier; comparing the gain with a predetermined target gain; and adjusting a power of an SR latch in the time amplifier when the gain is different from the target gain.

In some embodiments, the calculating of the gain of the time amplifier may include: detecting a time difference between two input signals of the time amplifier and a time difference of two output signals of the time amplifier; and dividing the time difference between two output signals by the time difference between the two input signals.

In other embodiments, the adjusting of the power of the SR latch may include adjusting a bias voltage of a transistor connected to a power input terminal of the SR latch.

In still other embodiments, the adjusting of the bias voltage of the transistor may include: increasing the bias voltage when the gain is less than the target gain; and decreasing the bias voltage when the gain is greater than the target gain.

In even other embodiments of the present invention, methods of controlling a time amplifier include: detecting a time difference between two input signals of a time amplifier; comparing the time difference between the two input signals with a predetermined marginal time difference; and adjusting a power of an SR latch in the time amplifier when the time difference between the two input signals is greater than the predetermined marginal time difference.

In some embodiments, the adjusting of the power of the SR latch may include adjusting a bias voltage of a current mirror connected to a power output terminal of the SR latch.

In other embodiments, the adjusting of the bias voltage of the current mirror may include decreasing the bias voltage when the time difference between the two input signals is greater than the marginal time difference.

In yet other embodiments of the present invention, non-transitory computer readable recording medium having a program recorded thereon, which, when executed by a computer, implements the method of amplifying a time amplifier.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
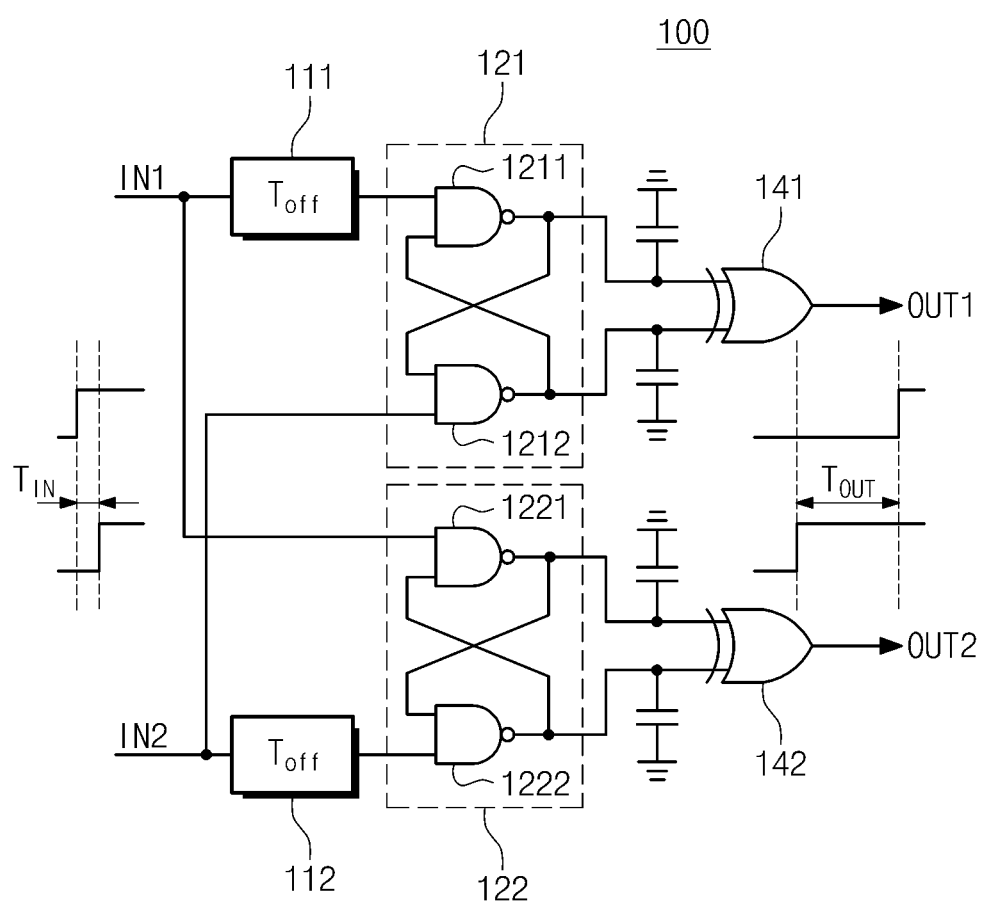
FIG. 1 is a circuit diagram of a time amplifier according to an embodiment of the present invention.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

Unless otherwise defined, all terms (including technical or scientific terms) used herein have the same meanings generally accepted by universal techniques in the art. Terms defined by general dictionaries are interpreted as having the same meanings as that in related techniques and/or this specification and if not clearly defined, are not conceptualized or not be interpreted as being overly excessive.

In the following description, the technical terms are used only for explaining specific embodiments while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components. As used herein, the term and/or includes any and all combinations of one or more of the associated listed items.

The term '~unit', 'device', 'block', or 'module' may mean a unit for processing at least one function or operation. For example, the term '~unit', 'device', '~block', or 'module' may means a software component or a hardware component such as an FPGA or an ASIC. However, '~unit', 'device', '~block', or 'module' is not limited to software or hardware. '~unit', 'device', '~block', or 'module' may be configured to be stored on an addressable storage medium and may be configured to execute at least one processor.

Accordingly, for example, '~unit', 'device', '~block', or 'module' may include components (e.g., software components, object oriented software components, class components, and task components), processes, functions, attributes, procedures, sub routines, program code segments, drivers, firmware, micro code, circuits, data, database, data structures, tables, arrays, and parameters. Functions provided in components and '~unit', 'device', 'block', or 'module' may be combined in less components and '~unit', 'device', '~block', or 'module' or may be further separated in more additional components and '~unit', 'device', '~block', or '~module'.

According to an embodiment of the present invention, at least one of a gain and an input range of a time amplifier may be adjusted by adjusting a power of an SR latch therein. Additionally, according to an embodiment of the present invention, when both a gain and an input range of a time amplifier are adjusted, they may be adjusted separately not affecting each other.

Hereinafter, it will be described about an exemplary embodiment of the present invention in conjunction with the accompanying drawings.

FIG. 1 is a circuit diagram of a time amplifier according to an embodiment of the present invention.

As shown in FIG. 1, the time amplifier 100 includes SR latches 121 and 122.

The SR latches 121 and 122 provide an output at the timing determined according to a time difference between two inputs inputted to the SR latches 121 and 122. The timing at which the SR latches 121 and 122 provide an output may be determined according to a time difference between two inputs due to the metastability of a transistor configuring the SR latches 121 and 122.

Additionally, the time amplifier 100 may include an operation determination unit for determining an operation of an SR latch connected to a power terminal of the SR latches 121 and 122.

Figure 2:
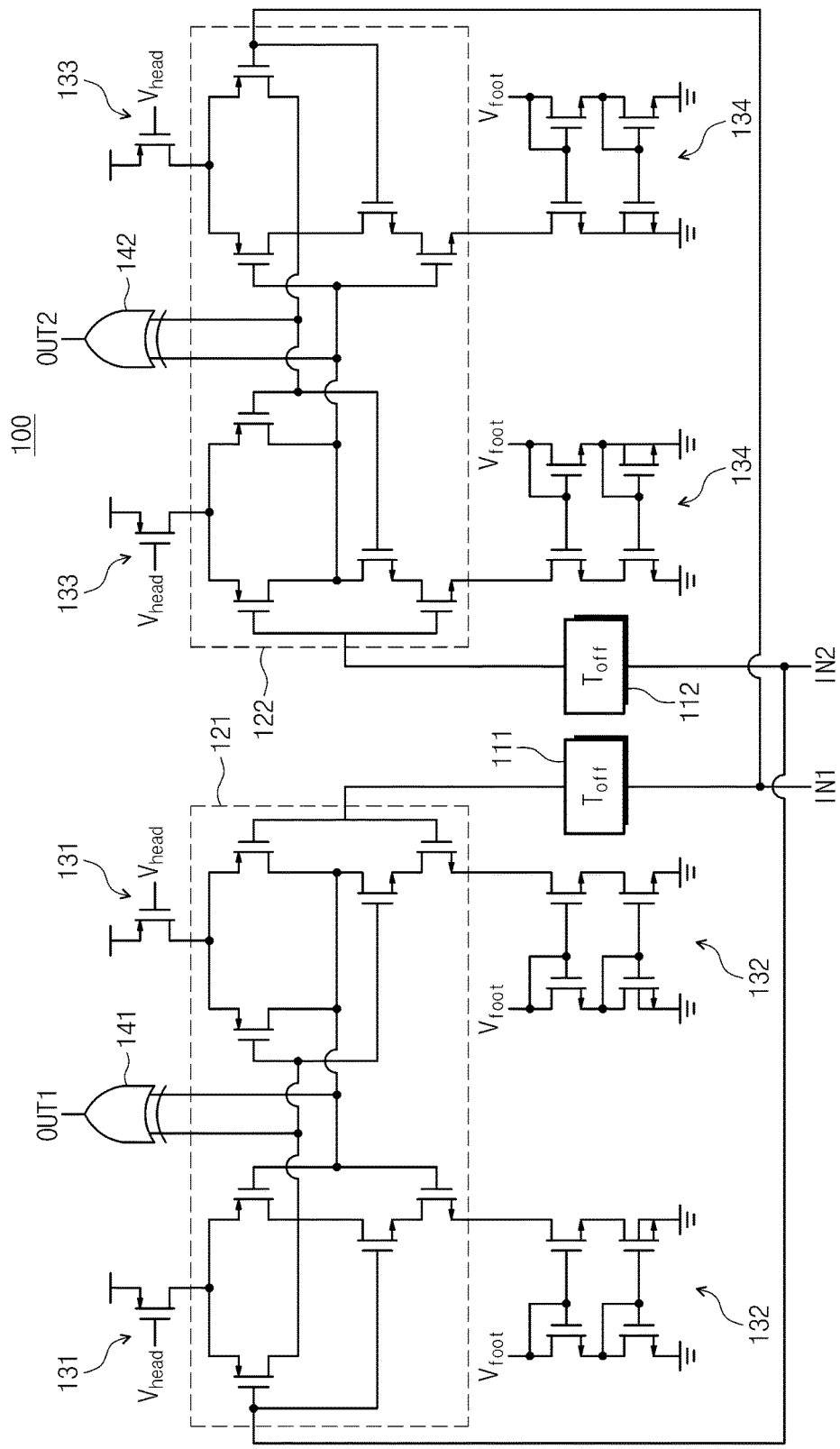
FIG. 2 is a circuit diagram of a time amplifier including an operation determination unit according to an embodiment of the present invention.

FIG. 2 is a circuit diagram of a time amplifier including an operation determination unit according to an embodiment of the present invention.

As shown in FIG. 2, the time amplifier 100 includes operation determination units 131, 132, 133, and 134 connected to a power terminal of the SR latches 121 and 122 to determine an operation of an SR latch.

If the time amplifier 100 of FIGS. 1 and 2 are described in more detail, it includes a first delay unit 111, a second delay unit 112, a first SR latch 121, a second SR latch 122, first SR latch operation determination units 131 and 132, second SR latch operation determination units 133 and 134, a first XOR gate 141, and a second XOR gate 142.

The first delay unit 111 may output a first delay input signal by delaying a first input signal IN1 by a predetermined time $T_{off}$. The second delay unit 112 may output a second delay input signal by delaying a second input signal IN2 by the predetermined time $T_{off}$.

Each of the first delay unit 111 and the second delay unit 112 may include at least one buffer. The number of buffers may be determined the predetermined time $T_{off}$.

The first SR latch 121 may provide an output at the timing determined according a time difference between the first delay input signal and the second input signal IN2. The second SR latch 122 may provide an output at the timing determined according a time difference between the first input signal IN1 and the second delay input signal.

Figure 3:
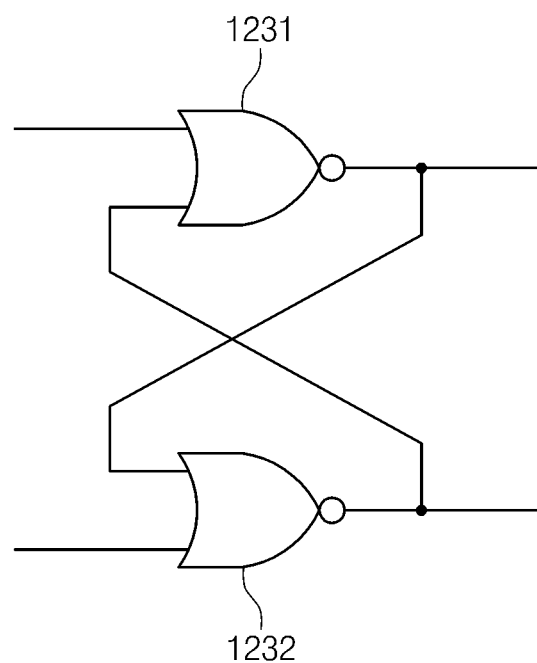
FIG. 3 is a circuit diagram of an SR latch according to another embodiment of the present invention.

Each of the SR latches 121 and 122 shown in FIGS. 1 and 2 are configured with two NAND gates, that is, a first NAND gates 1211 or 1221 and a second NAND gate 1212 or 1222 performing NAND operations, but according to an embodiment of the present invention, the SR latch 121 or 122 may include two NOR gates, that is, a first NOR gate 1231 and a second NOR gate 1232, as shown in FIG. 3, The operation determination units 131, 132, 133, and 134 may be connected to the power terminal of the SR latches 121 and 122 to determine operations thereof. For example, the first SR latch operation determination units 131 and 132 are connected to the power terminal of the first SR latch 121 to determine an operation of the first SR latch 121 and the second SR latch operation determination units 133 and 134 are connected to the power terminal of the second SR latch 122 to determine an operation of the second SR latch 122.

According to an embodiment of the present invention, the operation determination unit may include a first operation determination unit connected to the power input terminal of an SR latch. For example, the first SR latch operation determination unit may include a first operation determination unit 131 connected to the power input terminal of the first SR latch 121. Additionally, the second SR latch operation determination unit may include a third operation determination unit 133 connected to the power input terminal of the second SR latch 122.

According to an embodiment of the present invention, as shown in FIG. 2, each of the first operation determination unit 131 and the second operation determination unit 133 may include a transistor. The transistor may determine a power input of the SR latches 121 and 122 according to a bias voltage $V_{head}$ supplied to the gate of the transistor.

Figure 4:
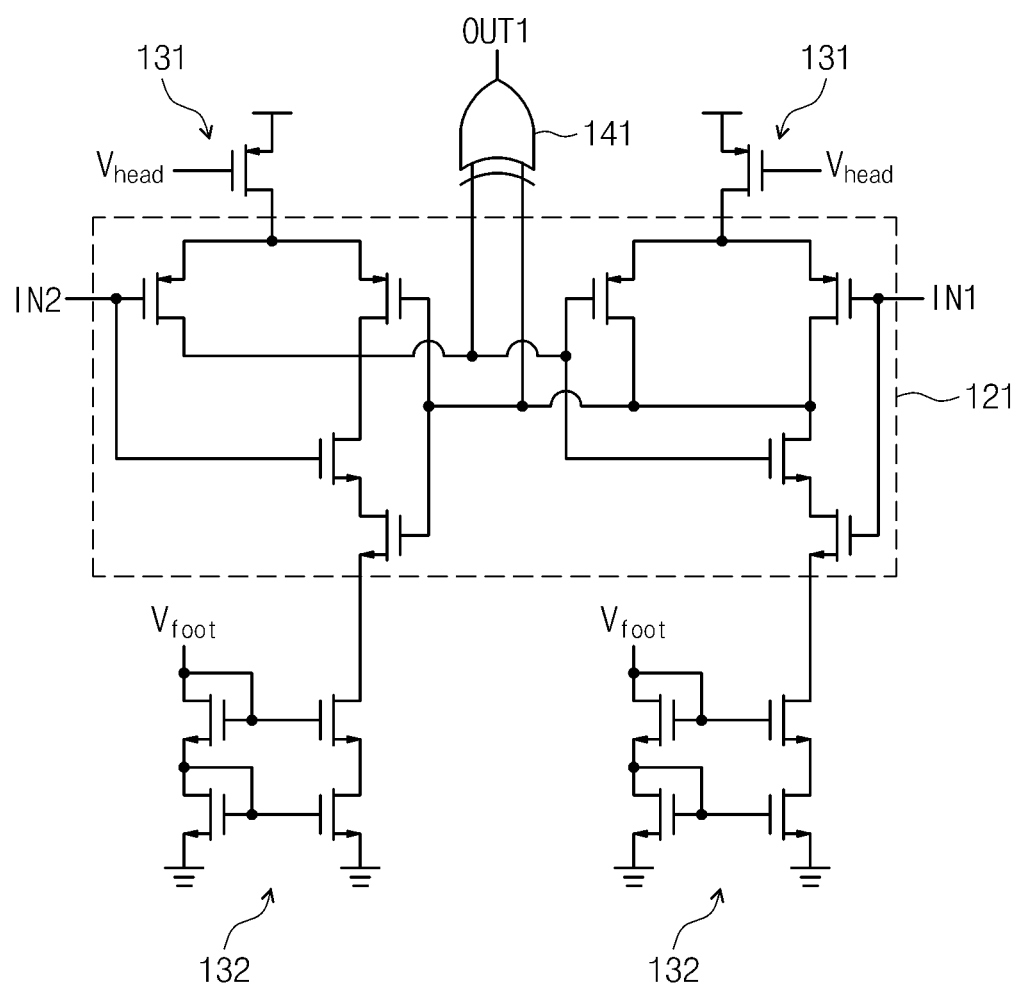
FIG. 4 is a circuit diagram of an SR latch connected to an operation determination unit according to an embodiment of the present invention.

FIG. 4 is a circuit diagram of the first SR latch 121 connected to the first operation determination unit 131 according to an embodiment of the present invention.

According to an embodiment of the present invention, a gain of the time amplifier may be adjusted by adjusting a bias voltage $V_{head}$ supplied to the gate of the transistor. That is, a gain of the time amplifier 100 may be determined by a bias voltage $V_{head}$.

According to an embodiment of the present invention, as the bias voltage $V_{head}$ becomes higher, a gain of the time amplifier 100 may become higher. On the contrary, as the bias voltage $V_{head}$ becomes lower, a gain of the time amplifier 100 may become lower.

According to another embodiment of the present invention, each of the first operation determination unit 131 and the third operation determination unit 133 may include a current mirror.

Figure 5:
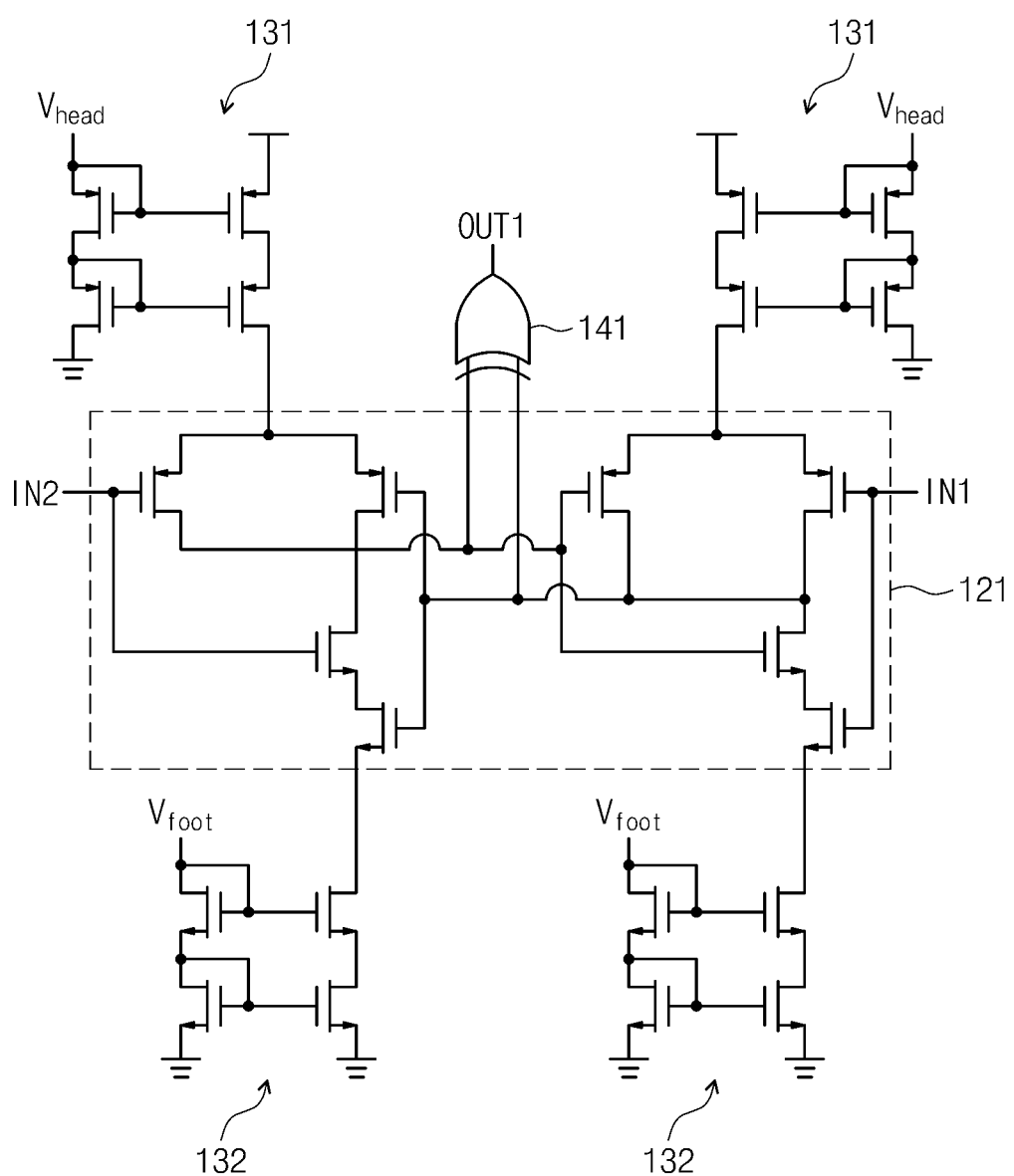
FIG. 5 is a circuit diagram of an SR latch connected to a first operation determination unit according to another embodiment of the present invention.

FIG. 5 is a circuit diagram of the first SR latch connected to the first operation determination unit 131 according to another embodiment of the present invention.

As shown in FIG. 5, the first operation determination unit 131 may include a current mirror. The current mirror may determine a power input of the SR latch 121 according to the bias voltage $V_{head}$ supplied to a gate.

According to this embodiment, the present invention adjusts a gain of the time amplifier 100 by adjusting the bias voltage $V_{head}$ of the current mirror.

According to another embodiment of the present invention, each of the first operation determination unit 131 and the third operation determination unit 133 may include a variable resistor.

Figure 6:
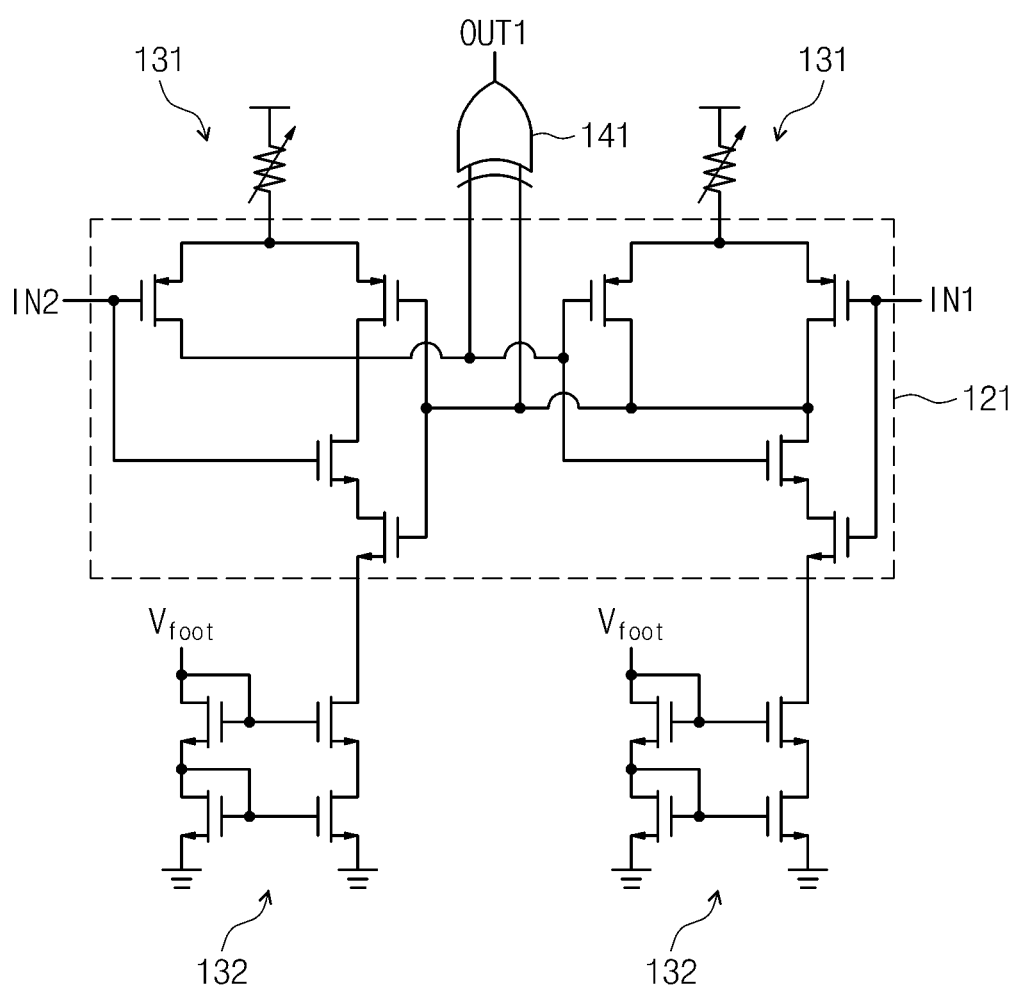
FIG. 6 is a circuit diagram of an SR latch connected to a first operation determination unit according to another embodiment of the present invention.

FIG. 6 is a circuit diagram of the first SR latch connected to the first operation determination unit 131 according to another embodiment of the present invention.

As shown in FIG. 6, the first operation determination unit 131 may include a variable resistor. The variable resistor may determine a power input of the first SR latch 121 according to a resistance value.

According to this embodiment, the present invention adjusts a gain of the time amplifier 100 by adjusting a resistance value of the variable resistor.

As mentioned above, the operation determination units 131 and 133 are connected to the power input terminal of the SR latches 121 and 122 in the time amplifier 100 and a gain of the time amplifier 100 is adjusted by adjusting the power of the SR latches 121 and 122 through the operation determination units 131 and 133.

According to an embodiment of the present invention, the operation determination unit may include a second operation determination unit 132 connected to the power output terminal of the SR latch. For example, referring to FIG. 2, the first SR latch operation determination unit may include a second operation determination unit 132 connected to the power output terminal of the first SR latch 121. Additionally, the second SR latch operation determination unit may include a fourth operation determination unit 134 connected to the power output terminal of the second SR latch 122.

According to an embodiment of the present invention, each of the second operation determination unit 132 and the fourth operation determination unit 134 may include a current mirror.

For example, as shown in FIGS. 2 and 4, each of the second operation determination unit 132 and the fourth operation determination unit 134 may include a current mirror and the current mirror determines a power output of the SR latches 121 and 122 according to a bias voltage $V_{foot}$ applied to a gate.

According to this embodiment, the present invention adjusts an input range of the time amplifier 100 by adjusting the bias voltage $V_{foot}$ of the current mirror.

Here, an available input range of a time amplifier represents a range in which the time amplifier maintains a gain uniformly. An input value (i.e., a time difference between two input signals) and an output value (i.e., a time different between two output signals) of the time amplifier may maintain linearity within a corresponding input range. However, with respect to an input value beyond the corresponding input range, a gain of the time amplifier is changed so that an output value for the input value has non-linearity.

According to this embodiment, the present invention may adjust an input value range, in which the linearity of an output value for an input value of the time amplifier 100 is secured, by adjusting the bias voltage $V_{foot}$ of the current mirror. As a result, an available input range of the time amplifier 100 may be adjusted. That is, an available input range of the time amplifier 100 may be determined by the bias voltage $V_{foot}$.

According to an embodiment of the present invention, as the bias voltage $V_{foot}$ becomes lower, the linearity of the time amplifier 100 is improved, so that an available input range may be broader. On the contrary, as the bias voltage $V_{foot}$ becomes higher, the linearity of the time amplifier 100 is deteriorated, so that an available input range may be narrower.

According to another embodiment of the present invention, each of the second operation determination unit 132 and the fourth operation determination unit 134 includes a transistor.

Figure 7:
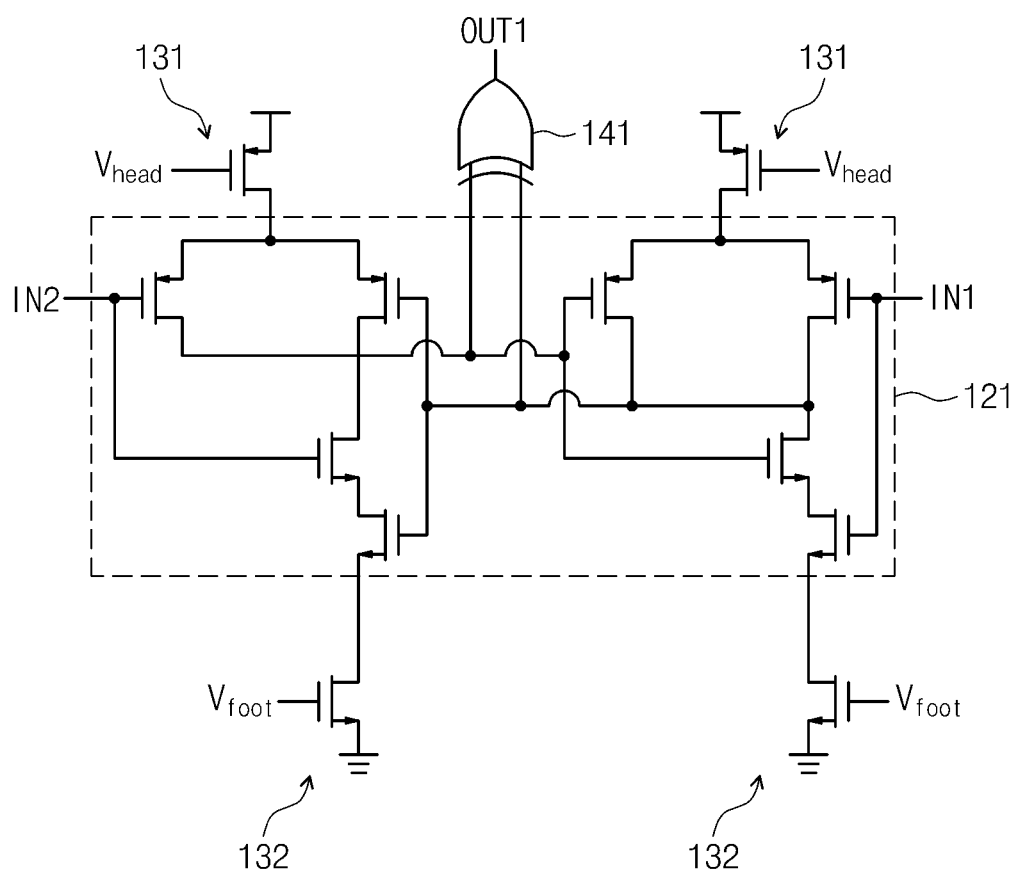
FIG. 7 is a circuit diagram of an SR latch connected to a second operation determination unit according to another embodiment of the present invention.

FIG. 7 is a circuit diagram of the first SR latch 121 connected to the second operation determination unit 132 according to another embodiment of the present invention.

As shown in FIG. 7, according to another embodiment of the present invention, the second operation determination unit 132 may include a transistor. The transistor may determine a power output of the SR latch 121 according to the bias voltage $V_{foot}$ applied to a gate.

According to this embodiment, the present invention may adjust an available input range of the time amplifier 100 by adjusting the bias voltage $V_{foot}$ of the transistor.

According to another embodiment of the present invention, each of the second operation determination unit 132 and the fourth operation determination unit 134 may include a variable resistor.

Figure 8:
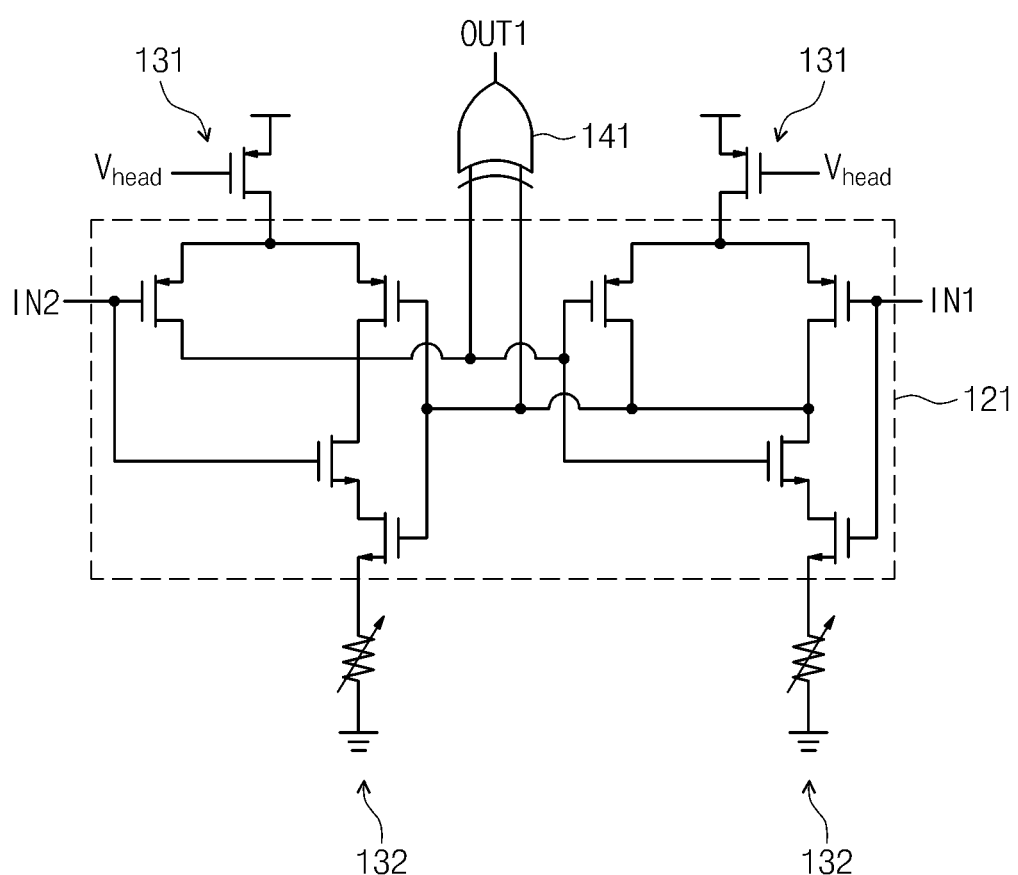
FIG. 8 is a circuit diagram of an SR latch connected to a second operation determination unit according to another embodiment of the present invention.

FIG. 8 is a circuit diagram of the first SR latch connected to the second operation determination unit 132 according to another embodiment of the present invention.

As shown in FIG. 8, according to another embodiment of the present invention, the second operation determination unit 132 may include a variable resistor. The variable resistor may determine a power output of the SR latch 121 according to a resistance value.

According to this embodiment, the present invention may adjust an available input range of the time amplifier 100 by adjusting a resistance value of the variable resistor.

As mentioned above, the operation determination units 132 and 134 are connected to the power output terminal of the SR latches 121 and 122 in the time amplifier 100 and the linearity of the time amplifier 100 and an available input range according thereto may be adjusted by adjusting the power of the SR latches 121 and 122 through the operation determination units 132 and 134.

Figure 9:
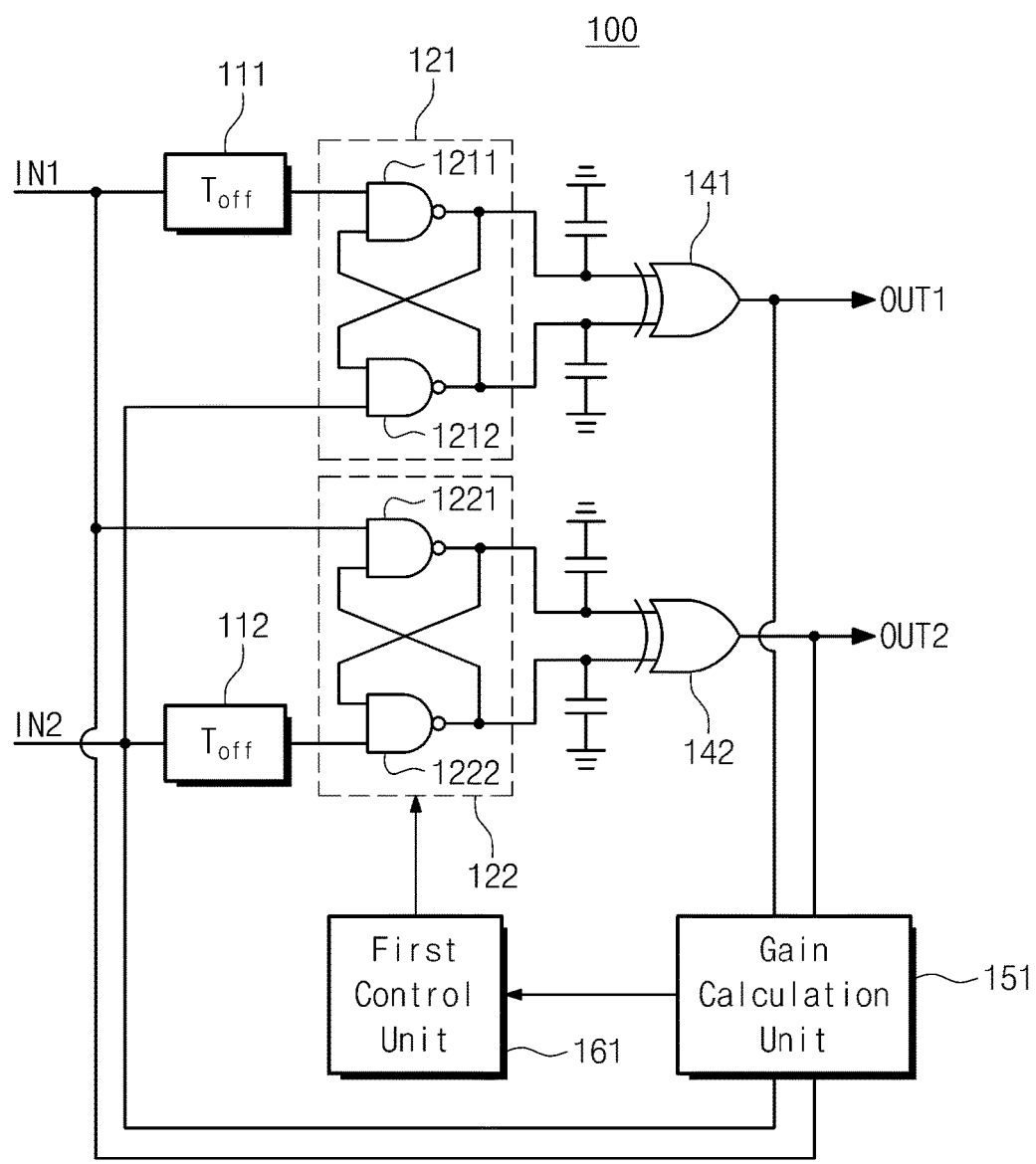
FIG. 9 is a circuit diagram of a time amplifier according to another embodiment of the present invention.

FIG. 9 is a circuit diagram of the time amplifier 100 according to another embodiment of the present invention.

As shown in FIG. 9, the time amplifier 100 may further include a gain calculation unit 151 and a first control unit 161.

The gain calculation unit 151 may calculate a gain of the time amplifier 100. The first control unit 161 may control operation determination units (i.e., the first operation determination unit 131 and the third operation determination unit 133) connected to the power input terminal of the SR latches 121 and 122 to that the calculated gain reaches a predetermined target gain.

According to an embodiment of the present invention, the gain calculation unit 151 may detect a time difference $T_{IN}$ between two input signals IN1 and IN2 of the time amplifier 100 and a time difference $T_{OUT}$ between two output signals OUT1 and OUT2 of the time amplifier 100. Then, the gain calculation unit 151 may calculate a gain of the time amplifier 100 by dividing the time difference $T_{OUT}$ between the two output signals OUT1 and OUT2 by the time difference $T_{IN}$ between the two input signals IN1 and IN2.

According to an embodiment of the present invention, when the gain is less than a target gain, a gain of the time amplifier 100 may be increased by increasing the bias voltage $V_{head}$ of the operation determination units 131 and 133 connected to the power input terminal of the SR latches 121 and 122, for example, the transistor shown in FIG. 2.

Additionally, when the gain is greater than a target gain, a gain of the time amplifier 100 may be decreased by decreasing the bias voltage $V_{head}$ of the operation determination units 131 and 133, for example, the transistor shown in FIG. 2, connected to the power input terminal of the SR latches 121 and 122.

Figure 10:
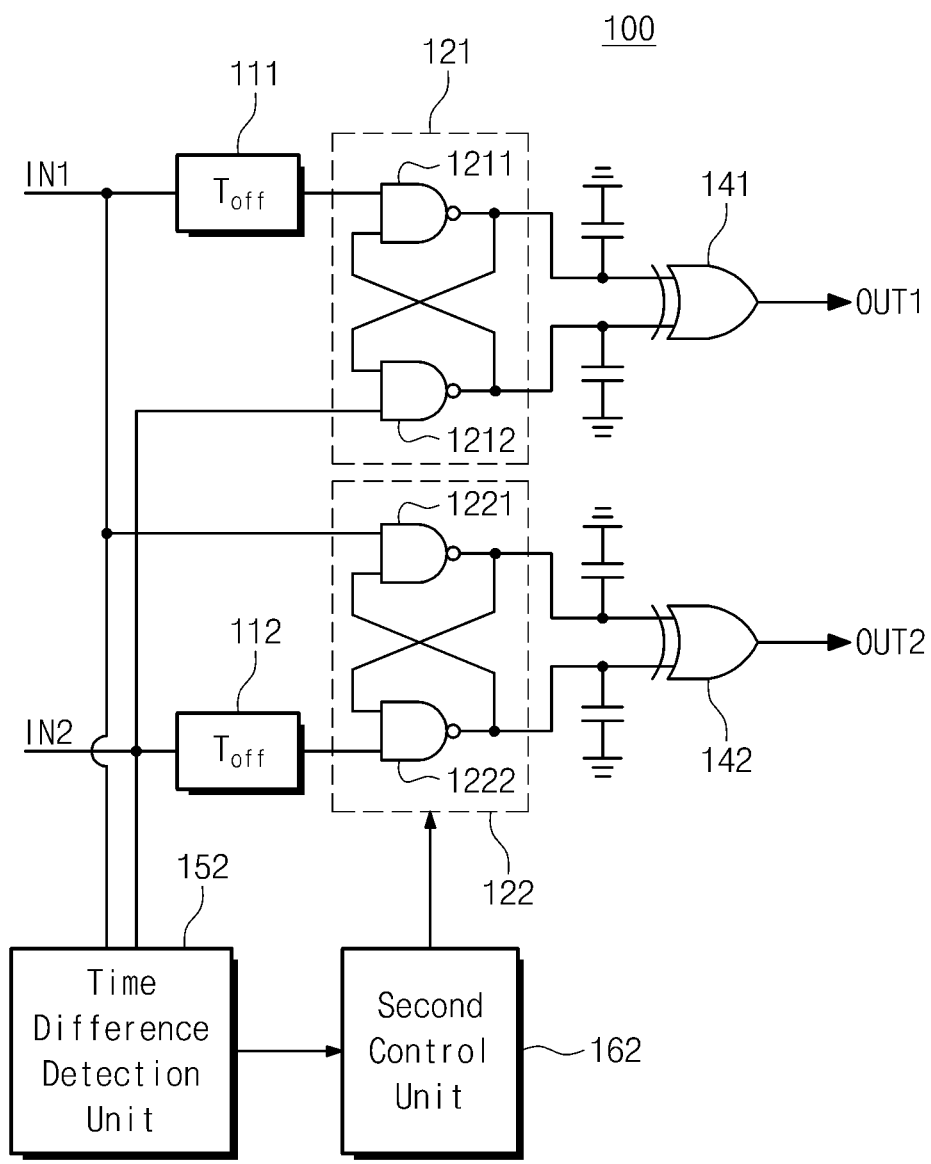
FIG. 10 is a circuit diagram of a time amplifier according to another embodiment of the present invention.

FIG. 10 is a circuit diagram of a time amplifier 100 according to another embodiment of the present invention.

As shown in FIG. 10, the time amplifier 100 includes a time difference detection unit 152 and a second control unit 162.

The time difference detection unit 152 may detect a time difference $T_{IN}$ between two input signals IN1 and IN2 of the time amplifier 100. When the time difference $T_{IN}$ between the two input signals N1 and IN2 is greater than a predetermined marginal time difference, the second control unit 162 may control the operation determination units (i.e., the second operation determination unit 132 and the fourth operation determination unit 134) connected to the power output terminal of the SR latches 121 and 122 so as to increase the marginal time difference.

Herein, the marginal time difference represents the maximum value of an input value that secures the linearity of an output value for an input value of the time amplifier 100. When an input value of the time amplifier 100 is identical or less than the marginal time difference, it is within an available input range of the time amplifier 100 and thus is amplified by a predetermined gain. However, when the input value of the time amplifier 100 becomes greater than mar-ginal time difference, it is beyond the available input range of the time amplifier 100 and is amplified by a gain different from the predetermined gain.

According to an embodiment of the present invention, when the time difference $T_{IN}$ between the two input signals IN1 and IN2 is greater than the marginal time difference, the second control unit 162 may increase the available input range of the time amplifier 100 by reducing the bias voltage $V_{foot}$ of the operation determination unit, for example, the current mirror of FIG. 2, connected to the power output terminal of the SR latches 121 and 122.

In such a way, as the available input range of the time amplifier 100 becomes broader, the marginal time difference becomes greater and when the time difference $T_{IN}$ between two input signals becomes less than or identical to the marginal time difference, a desired gain may be obtained.

According to an embodiment of the present invention, the first control unit 161 and the second control unit 162 may be configured as one and then may be implemented with one control unit.

Figure 11:
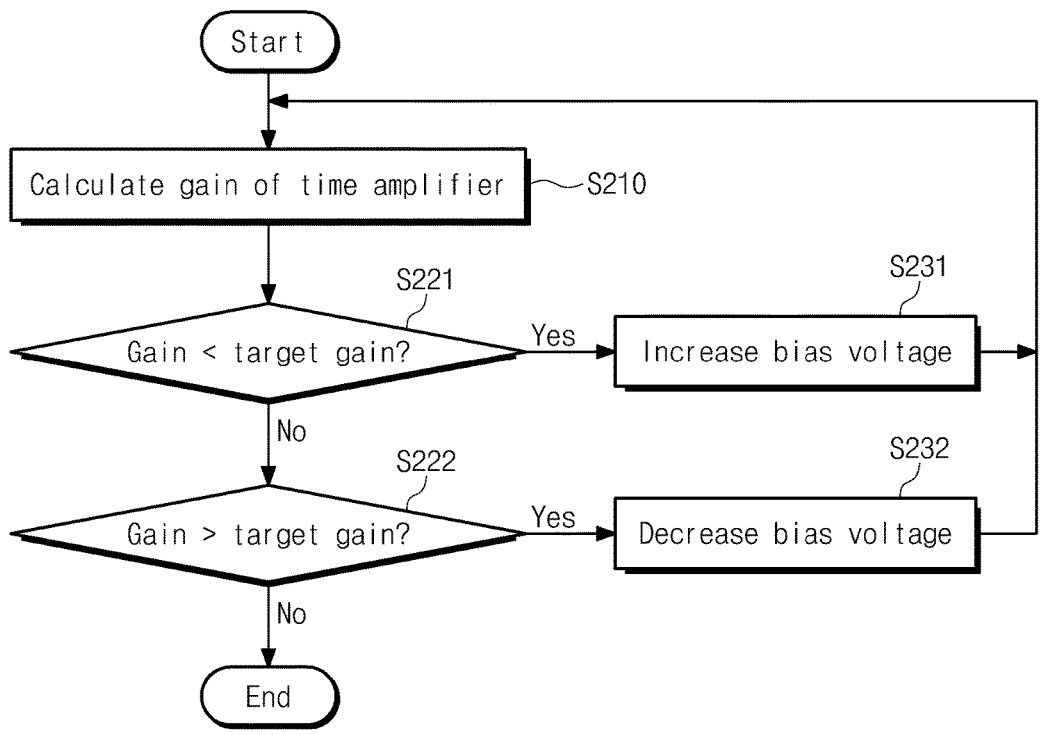
FIG. 11 is a flowchart illustrating a method of controlling a time amplifier according to an embodiment of the present invention.

FIG. 11 is a flowchart illustrating a time amplifier controlling method according to an embodiment of the present invention.

As shown in FIG. 11, the time amplifier controlling method 200 includes calculating a gain of the time amplifier 100 in operation S210, comparing the calculated gain with a predetermined target gain in operations S221 and S222, and adjusting a power of an SR latch in the time amplifier 100 when the calculated gain is different from the target gain in operations S231 and 232.

Figure 12:
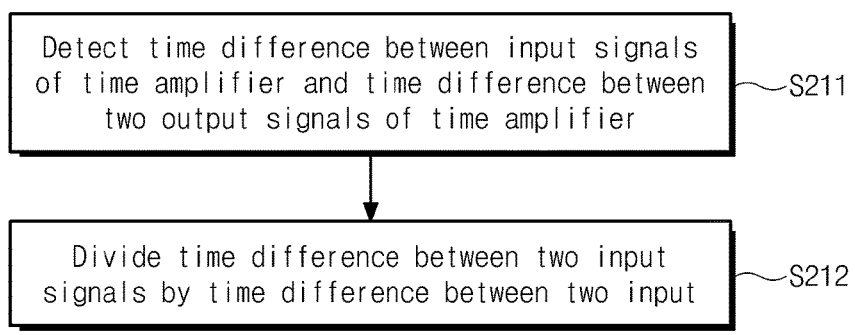
FIG. 12 is a flowchart illustrating a method of calculating a gain according to an embodiment of the present invention.

FIG. 12 is a flowchart illustrating a gain calculating process according to an embodiment of the present invention.

As shown in FIG. 12, the calculating of the gain of the time amplifier 100 in operation S210 includes detecting a time difference $T_{IN}$ between two input signals of the time amplifier 100 and a time difference $T_{OUT}$ between two output signals of the time amplifier 100 in operation S211 and dividing the time difference $T_{IN}$ between two input signals by the time difference $T_{OUT}$ between two input signals in operation S212.

According to an embodiment of the present invention, the adjusting of the power of the SR latch includes adjusting a bias voltage $V_{head}$ of a transistor connected to the power input terminal of the SR latches 121 and 122.

The adjusting of the bias voltage $V_{head}$ of the transistor includes increasing the bias voltage $V_{head}$ in operation S231 when the calculated gain is less than the target gain (YES in operation S221) and decreasing the bias voltage $V_{head}$ in operation S232 when the calculated gain is greater than the target gain (YES in operation S222).

According to another embodiment of the present invention, adjusting the power of the power of the SR latch includes adjusting the bias voltage $V_{head}$ of a current mirror connected to the power input terminal of the SR latches 121 and 122.

According to another embodiment of the present invention, adjusting the power of the power of the SR latch includes adjusting a resistance value of a variable resistor connected to the power input terminal of the SR latches 121 and 122.

Figure 13:
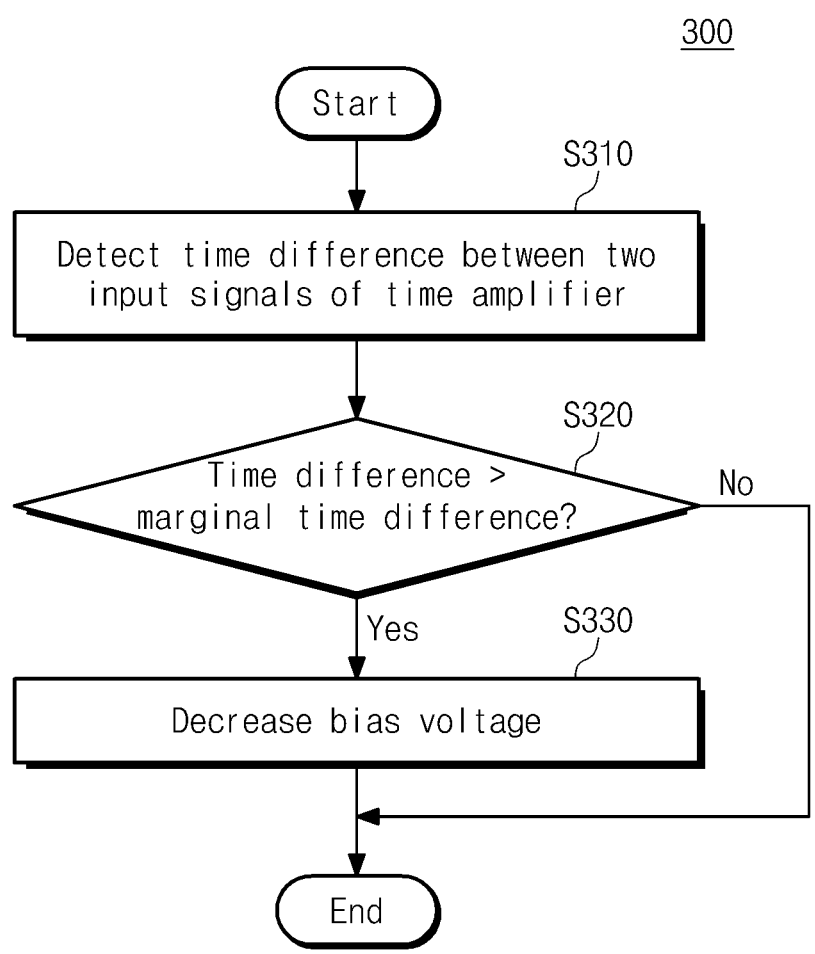
FIG. 13 is a flowchart illustrating a method of controlling a time amplifier according to another embodiment of the present invention.

FIG. 13 is a flowchart illustrating a time amplifier controlling method according to another embodiment of the present invention.

As shown in FIG. 13, the time amplifier controlling method 300 includes detecting a time difference $T_{IN}$ between the two input signals IN1 and IN2 of the time amplifier 100 in operation S310, comparing the time difference $T_{IN}$ between the two input signals IN1 and IN2 with a predetermined marginal time difference in operation 5320, and adjusting a power of the SR latches 121 and 122 in the time amplifier 100 in operation 5330 when the time difference $T_{IN}$ between the two input signals IN1 and IN2 is greater than the predetermined marginal time difference (YES in operation S320).

According to an embodiment of the present invention, the adjusting of the power of the SR latch includes adjusting the bias voltage $V_{foot}$ of a current mirror connected to the power output terminal of the SR latches 121 and 122.

The adjusting of the bias voltage $V_{foot}$ of the current mirror comprises decreasing the bias voltage $V_{foot}$ in operation 5330 when the time difference $T_{IN}$ between the two input signals is greater than the marginal time difference.

According to another embodiment of the present invention, the adjusting of the SR latch includes adjusting the bias voltage $V_{foot}$ of a transistor connected to the power output terminal of the SR larches 121 and 122.

According to another embodiment, the adjusting of the power of the SR latch includes adjusting a resistance value of a variable resistor connected to the power output terminal of the SR latches 121 and 122.

The time amplifier controlling method according to the above-mentioned embodiments of the present invention may be implemented as a program executed in a computer and stored in a computer readable recording medium. Examples of the computer readable recording medium include read-only memory (ROM), random-access memory (RAM), CD-ROMs, magnetic tapes, floppy disks, and optical data storage devices.

As mentioned above, a time amplifier adjusting a gain or an input rage thereof by adjusting a power provided to an SR latch in the time amplifier and a method of controlling the same are described.

According to an embodiment of the present invention, a gain or an input range of a time amplifier may be adjusted if necessary and a gain and an input range of a time amplifier may be adjusted separately. Therefore, the excellent performance of the time amplifier may be realized.

According to an embodiment of the present invention, a gain and an input range of a time amplifier may be adjusted.

According to an embodiment of the present invention, a gain and an input range of a time amplifier may be adjusted separately.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A time amplifier comprising:
an SR latch providing two output signals having an output time difference, which is determined according to an input time difference between two input signals of the time amplifier; and
an operation determination unit connected to a power of the SR latch and configured to determine an operation of the SR latch,
wherein the operation determination unit comprises:
a first operation determination unit connected to an input power of the SR latch and configured to determine a gain between the input time difference and the output time difference; and
a second operation determination unit connected to an output power of the SR latch and configured to determine an available input range of the input time difference,
wherein the input time difference and the output time difference of the time amplifier maintain linearity,
wherein the first operation determination unit and the second operation determination unit comprise transistor, respectively, and
wherein the gain and the available input range are determined, by adjusting a bias voltage of the transistor.

2. The time amplifier of claim 1, wherein the SR latch comprises a first NAND gate and a second NAND gate performing a NAND operation.

3. The time amplifier of claim 1, wherein the SR latch comprises a first NOR gate and a second NOR gate performing a NOR operation.

4. The time amplifier of claim 1, wherein the second operation determination unit comprises a current mirror determining the output power of the SR latch according to the bias voltage applied to a gate of the current mirror.

5. The time amplifier of claim 1, wherein the input power supplies a first adjustable voltage.

6. The time amplifier of claim 5, wherein the gain of the time amplifier is adjusted by adjusting the first adjustable voltage.

7. The time amplifier of claim 1, wherein the output power supplies a second adjustable voltage.

8. The time amplifier of claim 7, wherein the available input range of the time amplifier is adjusted by adjusting the second adjustable voltage.

9. A time amplifier comprising:
a first delay unit outputting a first delay input signal by delaying a first input signal of the time amplifier by a predetermined time;
a second delay unit outputting a second delay input signal by delaying a second input signal of the time amplifier by a predetermined time;
a first SR latch providing an output at a timing determined according to an input time difference between the first delay input signal and the second input signal;
a second SR latch providing an output at a timing determined according to the input time difference between the first input signal and the second delay input signal;
a first SR latch operation determination unit connected to a power of the first SR latch and configured to determine an operation of the first SR latch;
a second SR latch operation determination unit connected to a power of the second SR latch and configured to determine an operation of the second SR latch;
a first XOR gate outputting a first output signal by performing an XOR operation on the output of the first SR latch; and
a second XOR gate outputting a second output signal by performing an XOR operation on the output of the second SR latch,
wherein the first SR latch operation determination unit comprises:
a first operation determination unit connected to an input power of the first SR latch and configured to determine a gain between the input time difference and an output time difference between the first output signal and the second output signal; and a second operation determination unit connected to an output power of the first SR latch and configured to determine an available input range of the input time difference, in which, wherein the second SR latch operation determination unit comprises:
  a third operation determination unit connected to an input power of the second SR latch and configured to determine the gain between the input time difference and the output time difference; and
  a fourth operation determination unit connected to an output power of the second SR latch and configured to determine the available input range of the input time difference, wherein the input time difference and the output time difference of the time amplifier maintain linearity, wherein the first operation determination unit, the second operation determination unit, the third operation determination unit, and the fourth operation determination unit comprise transistor, respectively, and wherein the gain and the available input range are determined, by adjusting a bias voltage of the transistor.

10. The time amplifier of claim 9, wherein the second operation determination unit comprises a current mirror determining the output power of the first SR latch according to the bias voltage applied to a gate of the current mirror.

11. The time amplifier of claim 9, wherein the fourth operation determination unit comprises a current mirror determining the output power of the second SR latch according to the bias voltage applied to a gate of the current mirror.

12. The time amplifier of claim 9, wherein the gain of the time amplifier is adjusted by adjusting the input power of the first SR latch or the input power of the second SR latch.

13. The time amplifier of claim 9, wherein the available input range of the time amplifier is adjusted by adjusting the output power of the first SR latch or the output power of the second SR latch.

* * * * *